United States Patent
Mueller et al.

(10) Patent No.: US 9,318,315 B2
(45) Date of Patent: Apr. 19, 2016

(54) COMPLEX CIRCUIT ELEMENT AND CAPACITOR UTILIZING CMOS COMPATIBLE ANTIFERROELECTRIC HIGH-K MATERIALS

(71) Applicant: GLOBALFOUNDRIES Inc., Grand Cayman (KY)

(72) Inventors: Johannes Mueller, Dresden (DE); Dina H. Triyoso, Dresden (DE); Mark Gerard Nolan, Radebeul (DE); Wenke Weinreich, Dresden (DE); Konrad Seidel, Dresden (DE); Patrick Polakowski, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/176,208

(22) Filed: Feb. 10, 2014

(65) Prior Publication Data
US 2015/0014813 A1    Jan. 15, 2015

Related U.S. Application Data

(60) Provisional application No. 61/846,216, filed on Jul. 15, 2013.

(51) Int. Cl.
*H01L 21/02* (2006.01)
*H01L 21/28* (2006.01)
(Continued)

(52) U.S. Cl.
CPC ...... *H01L 21/02107* (2013.01); *H01L 21/0228* (2013.01); *H01L 21/02181* (2013.01);
(Continued)

(58) Field of Classification Search
CPC .............. H01L 21/02107; H01L 21/02181; H01L 21/02189; H01L 21/02194; H01L 21/0228; H01L 29/66181; H01L 29/94
See application file for complete search history.

(56) References Cited

U.S. PATENT DOCUMENTS

| 5,218,512 A | * | 6/1993 | Nakamura | ............ H01L 28/56 |
| | | | | 257/295 |
| 5,418,389 A | * | 5/1995 | Watanabe | .......... G11C 13/0007 |
| | | | | 257/295 |

(Continued)

FOREIGN PATENT DOCUMENTS

CN          101593755 B      2/2012

OTHER PUBLICATIONS

Khan et al., "Ferroelectric Negative Capacitance MOSFET: Capacitance Tuning & Antiferroelectric Operation," IEDM11-255-258, IEEE, 2011.

(Continued)

*Primary Examiner* — Nicholas Tobergte
(74) *Attorney, Agent, or Firm* — Amerson Law Firm, PLLC

(57) ABSTRACT

The present disclosure provides integrated circuit elements and MIM/MIS capacitors having high capacitance and methods of forming according integrated circuit elements and integrated MIM/MIS capacitors and methods of controlling an integrated circuit element and an integrated MIM/MIS capacitor. In various aspects, a substrate is provided and a dielectric layer or insulating layer is formed over the substrate. Furthermore, an electrode layer is disposed over the dielectric layer or insulating layer. Herein, the dielectric layer or insulating layer is in an antiferroelectric phase. In various illustrative embodiments, the integrated circuit element may implement a MOSFET structure or a capacitor structure.

23 Claims, 5 Drawing Sheets

(51) Int. Cl.
*H01L 29/66* (2006.01)
*H01L 29/94* (2006.01)

(52) U.S. Cl.
CPC .... *H01L21/02189* (2013.01); *H01L 21/02194* (2013.01); *H01L 21/28194* (2013.01); *H01L 29/66181* (2013.01); *H01L 29/94* (2013.01)

(56) References Cited

U.S. PATENT DOCUMENTS

| | | | | |
|---|---|---|---|---|
| 5,469,324 | A * | 11/1995 | Henderson | H05K 1/03 29/25.42 |
| 5,541,422 | A * | 7/1996 | Wolf | G11C 11/22 257/295 |
| 8,304,823 | B2 | 11/2012 | Boescke | |
| 2001/0050390 | A1* | 12/2001 | Kawai | H01L 28/84 257/301 |
| 2004/0157473 | A1 | 8/2004 | Hayashi et al. | |
| 2005/0070063 | A1* | 3/2005 | Im et al. | 438/240 |
| 2008/0105933 | A1* | 5/2008 | Yu et al. | 257/412 |
| 2008/0254204 | A1* | 10/2008 | Stapelmann | H01L 21/28194 427/99.2 |
| 2008/0308896 | A1* | 12/2008 | Boescke | 257/506 |
| 2009/0039447 | A1* | 2/2009 | Copel et al. | 257/411 |
| 2010/0006953 | A1* | 1/2010 | Boescke | G11C 11/22 257/410 |

OTHER PUBLICATIONS

Mueller et al., "Ferroelectricity in Simple Binary ZrO2 and HfO2," Nano Letters, 12:4318-23, 2012.
Salahuddin and Datta, "Use of Negative Capacitance to Provide Voltage Amplification for Low Power Nanoscale Devices," Nano Letters, 8:405-410, 2008.
Rabe, Karin M., Antiferrolectricity in oxides: a reexamination, Department of Physics and Astronomy, Rutgers University (2012).
Examination Report from Taiwan Patent Application No. 103117462 dated Sep. 21, 2015.

* cited by examiner

COMPLEX CIRCUIT ELEMENT AND CAPACITOR UTILIZING CMOS COMPATIBLE ANTIFERROELECTRIC HIGH-K MATERIALS

BACKGROUND OF THE INVENTION

1. Field of the Invention

The present disclosure generally relates to integrated circuits, and, more particularly, to circuit elements and capacitors engineered in accordance with advanced CMOS techniques in which antiferroelectric high-k materials are applied.

2. Description of the Related Art

In modern electronic equipment, integrated circuits (ICs) experience a vast applicability in a continuously spreading range of applications. Particularly, the demand for increasing mobility of electronic devices at high performance and low energy consumption drives developments to more and more compact devices having features with sizes ranging even into the deep sub-micron regime, the more so as current semiconductor technologies are apt of producing structures with dimensions in the magnitude of 10 nm. With ICs representing a set of electronic circuit elements integrated on a semiconductor material, normally silicon, ICs can be made much smaller than discrete circuits composed of independent circuit components. The majority of present-day ICs are implemented by using a plurality of circuit elements, such as field effect transistors (FETs), also called metal oxide semiconductor field effect transistors (MOSFETs or simply MOS transistors) and passive elements, such as resistors and capacitors, integrated on a semiconductor substrate with a given surface area. Typically, present-day integrated circuits involve millions of single circuit elements formed on a semiconductor substrate.

The basic function of a MOSFET is that of an electronic switching element, wherein a current through a channel between source and drain of a MOSFET is controlled by a gate to which a voltage relative to source and drain is applied. Particularly, in applying a voltage exceeding a characteristic voltage level, the conductivity state of a MOSFET is changed by the voltage being applied to the gate passing a certain voltage value. The characteristic voltage level, usually referred to as threshold voltage (Vt), characterizes the switching behavior of a MOSFET. In general, Vt depends nontrivially on the transistor's properties, such as material, etc.

It is well known that conventional MOSFETs require a change in the channel potential of at least 60 mV at 300 K to effect a change in the current by a factor of 10 (also referred to as subthreshold swing). This minimum subthreshold swing puts a fundamental lower limit on the operating voltage and, hence, on the power dissipation in standard MOSFET-based switches. In Salahuddin et al., Nanolett. 8, 405 (2008), it was suggested to replace the gate oxide of a FET with a ferroelectric insulating material of a thickness smaller than a critical thickness in order to implement a step-up voltage transformer amplifying the gate voltage. This suggestion was based on the theoretical observation that the ferroelectric insulating material having a thickness smaller than the critical thickness provides a capacitor with an effective negative capacitance arising from an internal positive feedback, offering a possibility to further reduce the subthreshold swing. In the publication Khan et al., "Ferroelectric Negative Capacitance MOSFET: Capacitance Tuning & Antiferroelectric Operation," IEDM (2011), a design methodology of ferroelectric negative capacitance FETs (NCFETs) was presented, wherein a high-k gate oxide of a MOSFET device was combined with a ferroelectric dielectric layer formed thereon. The thickness of the ferroelectric material was selected so as to result in a negative capacitance of about the same magnitude about compensating the capacitances in the MOSFET device, stabilizing the MOSFET with negative capacitance (NCFET=negative capacitance FET) and effectively increasing the resulting gate capacitance which enabled sub-60 mV/dec operation. A metal layer was disposed between the ferroelectric dielectric layer and the high-k gate oxide for averaging out charge non-uniformities due to domain formation in the ferroelectric dielectric. Khan et al. suggested designing the hysteresis loop of NCFETs having antiferroelectric characteristics within the VDD window.

Besides MOSFETs, typical integrated circuits may further have capacitors and resistors implemented as so-called integrated passive devices (IPDs) or integrated passive components (IPCs) for forming functional blocks, such as impedance-matching circuits, harmonic filters, couplers etc. IPDs or IPCs can be generally fabricated using standard semiconductor manufacturing technologies which are well known in the fabrication of MOSFETs. Capacitors may be implemented by means of metal insulator semiconductor structures (MIS structures) or metal insulator metal structures (MIM structures) having a metal layer formed on an insulating material, which in turn is disposed on a semiconductor material in MIS structures or on a metal layer in MIM structures. Typical applications of MIS/MIM capacitors concern power supply buffering, RF decoupling or boost converters.

In improving ICs, it turned out that capacitors having higher capacitance are required for enabling a greater amount of energy to be stored in the electrostatic field of the capacitor, while the demand for higher performance requires faster charging/discharging in shorter time periods. At present, the capacitance of integrated planar MIS/MIM capacitors is limited to 20 fF/$\mu m^2$ because of constraints imposed by the available chip area and materials to be used as dielectrics in advanced capacitors. The latter constraints arise from contamination issues present in CMOS technologies which restrict dielectrics used in MIS/MIM capacitors of advanced ICs to be compatible with the CMOS technology. Although, in general, the capacitance of a capacitor may be increased by increasing its surface, decreasing the distance between its electrodes and increasing the dielectric constant or k-value of a dielectric disposed in between the electrodes of a capacitor. However, in advanced ICs, decreasing the distance between the electrodes is limited due to the appearance of leakage currents with decreasing thickness of the dielectric. Therefore, current developments consider increasing the surface of the electrode by means of so-called 3D capacitors in which a dense network of pores is formed in the surface of a semiconductor substrate, the pores being filled with a high-k dielectric material such that higher capacitance densities may be obtained. Still, increasing the capacitance raises another issue which will be described with regard to FIG. 1.

FIG. 1 represents a graphic relation between the charge of a MIS/MIM capacitor plotted on the ordinate and the voltage applied to the capacitor plotted on the abscissa. The MIS/MIM capacitor was formed in accordance with conventional techniques and measured by the inventors. As indicated in FIG. 1, a required high target load of, for example, 15 $\mu C/cm^2$ involves a high voltage drop across the capacitor, in the given example about 7 V, possibly causing dielectric breakdown and, therefore, posing a risk to the reliability of the whole IC comprising the capacitor.

Conventionally, capacitors with high capacitances are located on or in chip interposers and suitable integrated capacitors showing high capacitances are not available, such that space-consuming external passive components appear to be the only choice at present.

Ferroelectric dielectrics have been recently considered with regard to ferroelectric FETs (FeFETs) in non-volatile memory applications. U.S. Pat. No. 8,304,823 represents an approach in this respect suggesting usage of a hafnium and/or zirconium including ferroelectric material as a gate oxide in FeFETs.

Although ferroelectric and antiferroelectric dielectrics are generally known to have high dielectric constants or k-values, implementations, particularly of antiferroelectric dielectrics, raise new issues when considering concrete applications in advanced semiconductor fabrication. For example, typical antiferroelectric films have a thickness of several 100 nm, and conventional antiferroelectric materials like perovskites, e.g., PZT, $BaTiO_3$ and SBT, are not compatible with semiconductor manufacturing environments as contaminations are introduced, possibly causing yield losses in semiconductor fabrication plants.

It is desirable to provide integrated circuit elements and MIM/MIS capacitors having high capacitances. Furthermore, it is desirable to provide a method of forming an integrated circuit element having a high capacitance and a method of controlling an integrated circuit element and a method of controlling a MIM/MIS capacitor having a high capacitance.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure provides integrated circuit elements and MIM/MIS capacitors having high capacitance and methods of forming according integrated circuit elements and integrated MIM/MIS capacitors. In various aspects, a substrate is provided and a dielectric layer or insulating layer is formed over the substrate. Furthermore, an electrode layer is disposed over the dielectric layer or insulating layer. Herein, the dielectric layer or insulating layer is in an antiferroelectric phase. In various illustrative embodiments, the integrated circuit element may represent a MOSFET structure or a capacitor structure.

In a first aspect of the present disclosure, an integrated circuit element is provided, the integrated circuit element comprising a substrate, a dielectric layer formed over a surface of the substrate, and an electrode layer formed over the dielectric layer, wherein the dielectric layer is in an antiferroelectric phase.

In a second aspect of the present disclosure, an integrated MIM/MIS capacitor is provided, the integrated MIM/MIS capacitor comprising a semiconductor substrate, a bottom electrode formed on the semiconductor substrate, an insulating layer formed on the bottom electrode, and a top electrode formed on the insulating layer, wherein the insulating layer is in an antiferroelectric phase. In some illustrative examples herein, at least one of the bottom electrode and the top electrode may be formed by a metal material, such as comprising TiN, TaN, Ru, Pt and/or the like.

In a third aspect of the present disclosure, a method of forming an integrated circuit element is provided, the method comprising providing a substrate, depositing an amorphous high-k dielectric material layer on the substrate, depositing a capping layer on the amorphous high-k dielectric material layer, and inducing crystallization in at least a portion of the amorphous high-k dielectric material layer, the crystallized high-k dielectric material layer being in an antiferroelectric phase. In some illustrative embodiments herein, the crystallization may be induced prior to the deposition of the capping layer. In some alternative embodiments herein, the crystallization may be induced after the capping layer is deposited on the amorphous high-k dielectric material layer.

In an illustrative embodiment herein, a method of forming an integrated MIM/MIS capacitor is provided, the method comprising providing a substrate, depositing an amorphous high-k dielectric material layer on the substrate, depositing a capping layer on the amorphous high-k dielectric material layer, and inducing crystallization in the amorphous high-k dielectric material layer, the crystallized high-k dielectric material layer being in an antiferroelectric phase. In some illustrative embodiments herein, the crystallization may be induced prior to the deposition of the capping layer. In some alternative embodiments herein, the crystallization may be induced after the capping layer is deposited on the amorphous high-k dielectric material layer.

BRIEF DESCRIPTION OF THE DRAWINGS

The disclosure may be understood by reference to the following description taken in conjunction with the accompanying drawings, in which like reference numerals identify like elements, and in which.

Figure 1:
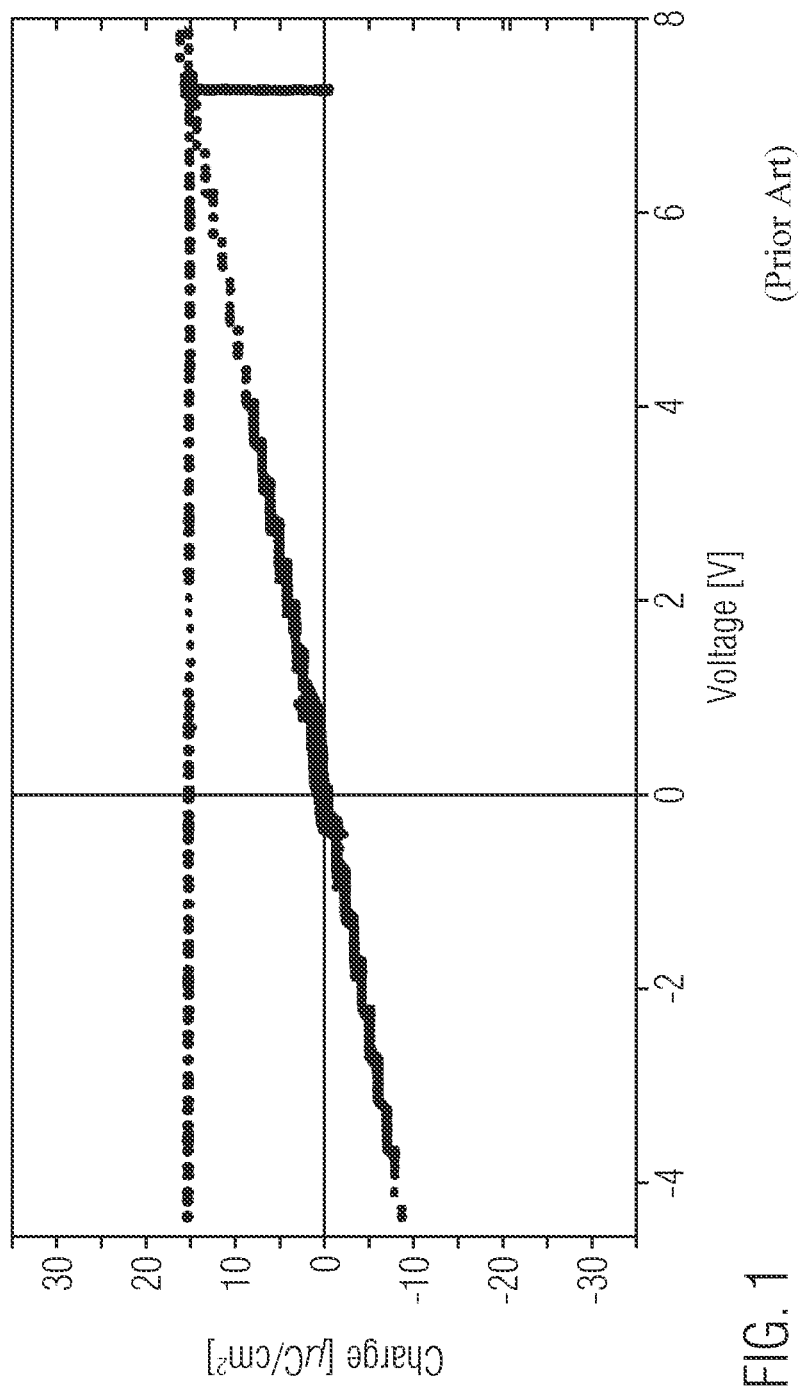
FIG. 1 schematically shows a graphical relation between charge density and voltage of capacitor as measured by the inventors.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures.

Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure relates to semiconductor devices integrated on or in a chip and semiconductor device structures integrated on or in a chip which may be considered as integrated circuit elements, such as metal oxide semiconductor devices (MOS devices) or capacitors, e.g., MIM/MIS capacitors.

When referring to MOS devices, the person skilled in the art will appreciate that although the expression "MOS device" is used, no limitation to a metal-containing gate material and/or to an oxide-containing gate dielectric material is intended.

When referring to MIM/MIS capacitors, the person skilled in the art will appreciate that although the expression "MIM/MIS" is used, no limitation to a metal-containing electrode is intended.

Integrated circuit elements of the present disclosure, and particularly MOS devices and/or capacitors as illustrated by means of some illustrative embodiments as described herein, concern elements fabricated by using advanced technologies. Integrated circuit elements of the present disclosure are fabricated by technologies applied to approach technology nodes smaller than 100 nm, for example smaller than 50 nm or smaller than 35 nm. The person skilled in the art will appreciate that the present disclosure suggests integrated circuit elements, having structures with minimal length and/or width dimensions smaller than 100 nm, for example smaller than 50 nm or smaller than 35 nm.

The person skilled in the art understands that MOS transistors may be fabricated as P-channel MOS transistors or PMOS transistors and as N-channel transistors or NMOS transistors, and both may be fabricated with or without mobility enhancing stressor features or strain-inducing features. A circuit designer can mix and match device types, using PMOS and NMOS transistors, stressed and unstressed, to take advantage of the best characteristics of each device type as they best suit the circuit being designed. The person skilled in the art understands that stress and strain may be generally described with regard to the tensile modulus.

Figure 2A:
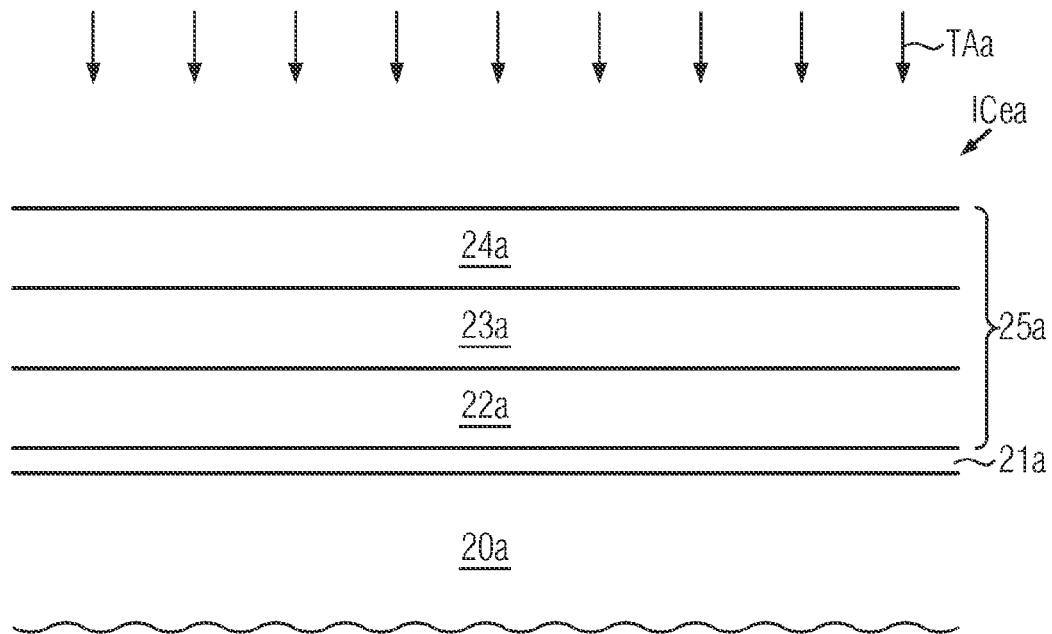
FIGS. 2a-2b schematically illustrate in cross-sectional views integrated circuit elements during phases of manufacturing in accordance with illustrative embodiments of the present disclosure.

With regard to FIGS. 2a-2b, various illustrative embodiments of the present disclosure relating to integrated circuit elements will be described in greater detail. FIG. 2a shows an integrated circuit element ICea at a stage during fabrication, in which a substrate 20a is provided and a layer stack 25a is formed over the substrate 20a, particularly over a surface of the substrate 20a. The substrate 20a may comprise a semiconductor material which may be selected from silicon, germanium, silicon/germanium, silicon/carbon, silicon/germanium/carbon, gallium arsenide, indium arsenide, indium phosphate and other appropriate semiconductor materials. In some special illustrative embodiments, the semiconductor substrate may be formed by silicon. The person skilled in the art will appreciate that the semiconductor substrate 20a may be a single crystalline silicon layer having a surface orientation, i.e., a crystallographic orientation of the surface normal of a top surface of the semiconductor substrate 20a, being one of a major crystallographic orientation. The semiconductor substrate 20a may be a bulk substrate, a semiconductor-on-insulator (SOI) substrate or a hybrid substrate. The semiconductor substrate 20a may further have a built-in stress which does not pose any limitation to the present disclosure. The semiconductor substrate 20a may be doped, such as having one or more well regions, or alternatively may be undoped at the stage shown in FIG. 2a.

As shown in FIG. 2a, a thin dielectric liner 21a may be formed on the substrate 20a. In an illustrative embodiment, the dielectric liner 21a may be a silicon oxide liner having a thickness of several angstroms to several nanometers, such as, for example, at most 3 nm. This does not pose any limitation to the present disclosure and the person skilled in the art will appreciate that the dielectric liner 21a may be omitted in alternative embodiments.

The layer stack 25a is formed over the substrate 20a so as to cover at least a surface portion of the substrate 20a. The layer stack 25a comprises a first layer 22a, an insulating layer 23a and a second layer 24a. The first layer 22a is disposed over the substrate 20a, the insulating layer 23a is disposed over the first layer 22a and the second layer 24a is disposed over the insulating layer 23a. The first layer 22a may be at least one of a semiconductor material-containing layer and a metal-containing layer. In a first illustrative example, the first layer 22a may be a bottom electrode layer comprising TiN, TaN, Ru, Pt and/or the like. In a second illustrative example, the first layer 22a may be a semiconductor layer, such as a silicon layer or a silicon-comprising layer, for example.

The insulating layer 23a may comprise at least one of Hf and Zr and/or may comprise one or more additional dopants, such as Si and Al and Ge and Mg and Ca and Sr and Ba and Ti and rare earth elements. The person skilled in the art will appreciate that additional dopants may be incorporated into Hf comprising material to invoke the antiferroelectric phase and/or adjust the voltage position of the local capacitance/polarization/k-value boost. In some illustrative examples, a concentration of additional dopants may be in a range from about 0.2-30 mol %, such as in a range from about 0.5-20 mol %. The insulating layer 23a may be formed on the first layer 22a by performing a deposition process, such as an ALD process or a CVD process or a PVD process. The thickness of the insulating layer 23a may be in a range from about 1-100 nm, for example in a range from about 6-60 nm.

In some special illustrative examples, the insulating layer 23a may be of $Hf_aX_bO_2$ material, where X represents one of Zr, Si and Al. In a first explicit example, X may represent Zr and $a<0.5$, $b>0.5$, e.g., $a<0.7$, $b>0.3$. In a second explicit example, X may represent Si and $0.05<b<0.2$, $0.88<a<0.95$. In an illustrative example herein, b may be further in a range given by 0.05<b<0.12. In a third explicit example, X may represent Al and 0.05<b<0.12, 0.88<a<0.95. The person skilled in the art will appreciate that these explicit examples do not limit the present disclosure and are provided for illustrative purposes only.

The second layer 24a may comprise a material composed of at least one of a metal nitride material and a noble metal material and their respective oxides. In an explicit illustrative example, the second layer may comprise TiN, TaN, Ru, Pt and/or the like. In some illustrative embodiments, the second layer may comprise at least a sub-layer comprising TiN, TaN, Ru, Pt and/or the like. The thickness of the second layer 24a may be up to about 30 nm, for example to about 15 nm or to about 10 nm. Depending on the application, the second layer may form a top electrode or a sub-layer of an electrode layer, such as a work-function adjusting material layer of a gate electrode of a MOS transistor. In illustrative examples of the latter, a further gate electrode layer (not illustrated) may be formed over the second layer 24a, e.g., a polysilicon layer. In applications relating to passive elements, particularly to capacitors, the second layer 24a may represent an electrode and may comprise TiN or another appropriate electrode material. For example, the second layer 24a may be a capping layer formed by TiN for encapsulating the insulating layer 23a, but as well serve as an electrode.

The person skilled in the art will appreciate that the first and second layers 22a, 24a and the insulating layer 23a may be formed by performing deposition processes, such as PVD and/or CVD and/or ALD processes. The person skilled in the art will appreciate that appropriate precursor systems can be used to form the first and second layers 22a, 24a and/or the insulating layer 23a.

In the following, an illustrative example will be described which is not intended to limit the present disclosure but merely exemplifies an illustrative process in accordance with the present disclosure.

Figure 3:
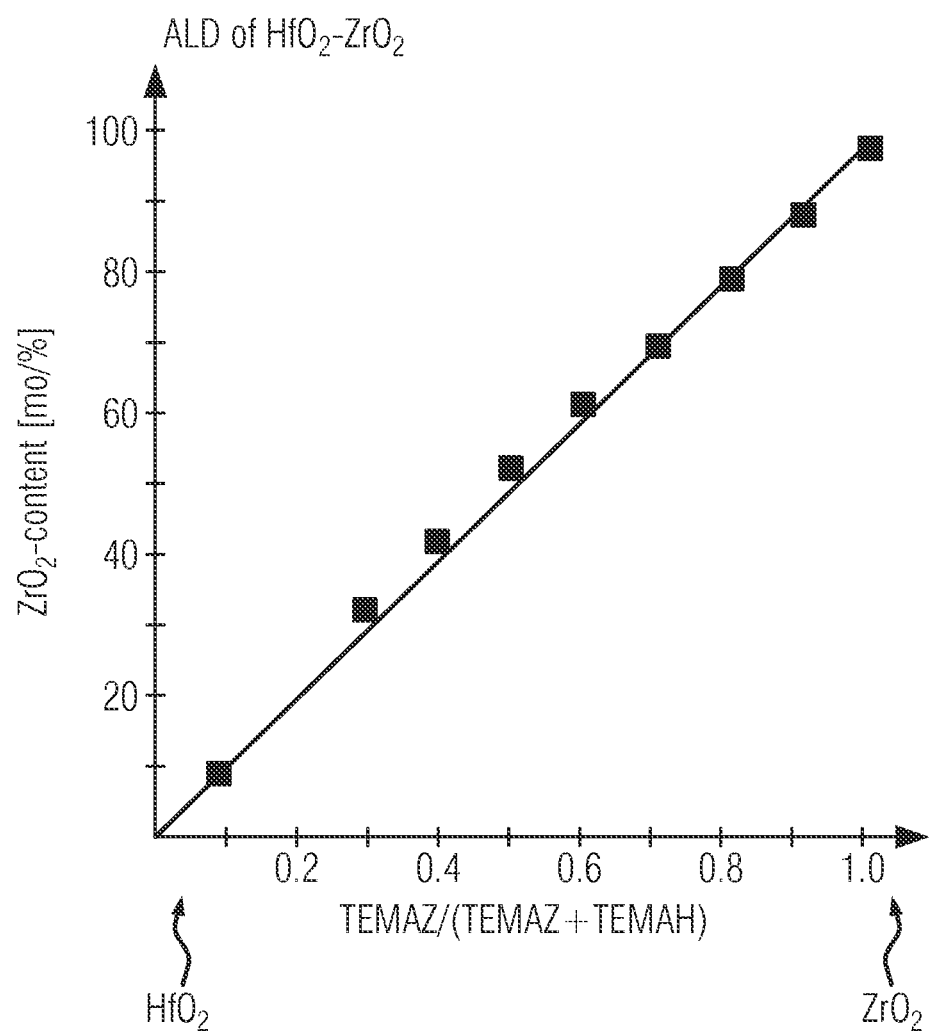
FIG. 3 schematically illustrates a graphical relation between $ZrO_2$— content and a ratio of precursors used in an illustrative ALD deposition process for providing an $HfO_2$—$ZrO_2$ solid solution.

In accordance with an explicitly disclosed illustrative example, an ALD process may be performed to prepare the insulating layer 23a having an HfO$_2$—ZrO$_2$ solid solution. In a special illustrative example herein, the ALD deposition cycles may utilize alkylamide precursors TEMAH and TEMAZ. The person skilled in the art will appreciate that the ZrO$_2$ content in ZrO$_2$ may be adjusted by ALD pulsing ratios of the utilized alkylamide precursors. Due to a near similar growth of both precursors in each deposition cycle, a linear and almost direct stoichiometry control by the ALD cycle ratio may be enabled. In this respect, FIG. 3 shows illustrative cycle ratios resulting in different ZrO$_2$ contents (measured in mol % and plotted on the abscissa). In some special illustrative embodiments of the present disclosure, the insulating layer 23a is formed as an amorphous layer.

Subsequently to depositing the insulating layer 23a, a second layer forming material may be deposited on the insulating layer 23a so as to form the second layer 24a. In accordance with an exemplary embodiment, the second layer forming material is formed by performing a deposition process having a deposition temperature below the crystallization temperature of the insulating layer 23a. Therefore, the insulating layer 23a deposited as an amorphous layer may be encapsulated by the second layer forming material while conserving the amorphous condition of the insulating layer 23a.

After having formed the insulating layer 23a, a thermal anneal process TAa may be performed to induce crystallization in at least a portion of the insulating layer 23a. Possible annealing temperatures may be in the range from about 250-1200° C. In some special illustrative examples herein, the annealing temperatures may be, e.g., in a range from about 250-800° C. or in a range from about 500-1100° C., for example. The person skilled in the art will appreciate that these explicitly disclosed examples do not limit the present disclosure. It is noted that the annealing temperature may be chosen in dependence on the thickness of at least the insulating layer 23a and/or on the material content of at least the insulating layer 23a, for example, the annealing temperature may be chosen in dependence on at least one of an Hf— content, an Zr— content, an Al— content, an Si— content and a Ge— content In some illustrative examples herein, the thickness of the insulating layer 23a may be in a range from about 5-15 nm. In an explicit example having an insulating layer comprising an HfO—ZrO$_2$ composition or being of pure ZrO$_2$, the process TAa may be implemented such that a thermal budget may implement an annealing temperature out of a range from about 250-800° C. In another explicit example having an insulating layer with dopants of Si and/or Al incorporated therein, the process TAa may be implemented such that a thermal budget may implement an annealing temperature out of a range from about 500-1100° C. For example, when considering insulating material with a dopant concentration for Si of about 6%, the annealing temperature may be at least of about 550° C., while an annealing temperature of at least about 550° C. may be chosen for an Al-dopant concentration of about 7%. The person skilled in the art will appreciate that crystallization may in general depend on the material and material composition of the insulating layer 23a. As a result, the ICea as shown in FIG. 2a may be formed so as to comprise, at this stage of fabrication, an insulating layer 23a being at least partially in the antiferroelectric phase.

In some illustrative embodiments herein, the thermal anneal process TAa may be performed prior to forming the second layer 24a on the insulating layer 23a. Alternatively, the thermal anneal process TAa may be performed after having formed the second layer 24a on the insulating layer 23a. The person skilled in the art will appreciate that the thermal anneal process TAa may, in some illustrative embodiments, be a rapid thermal anneal process (RTA).

In illustrative embodiments comprising performing the thermal anneal process TAa prior to forming the second layer 24a on the insulating layer 23a, the thermal budget of the thermal annealing process TAa may be slightly above the crystallization temperature, which may be chosen in dependence on optional dopants and/or dopant concentrations and/or layer thickness.

In illustrative embodiments comprising forming the second layer 24a on the insulating layer 23a prior to performing the thermal annealing process TAa, the thermal budget of a process performed for forming the second layer 24a may be slightly above the crystallization temperature, which may be chosen in dependence on optional dopants and/or dopant concentrations and/or layer thickness.

Other illustrative embodiments of the present disclosure will be explained with regard to FIG. 2b. FIG. 2b shows an integrated circuit element ICeb at a stage during fabrication, in which a substrate 20b is provided and a layer stack 25b is formed over the substrate 20b, particularly over a surface of the substrate 20b. The substrate 20b may be substantially provided in analogy to the substrate 20a as discussed above with regard to FIG. 2a.

Figure 2B:
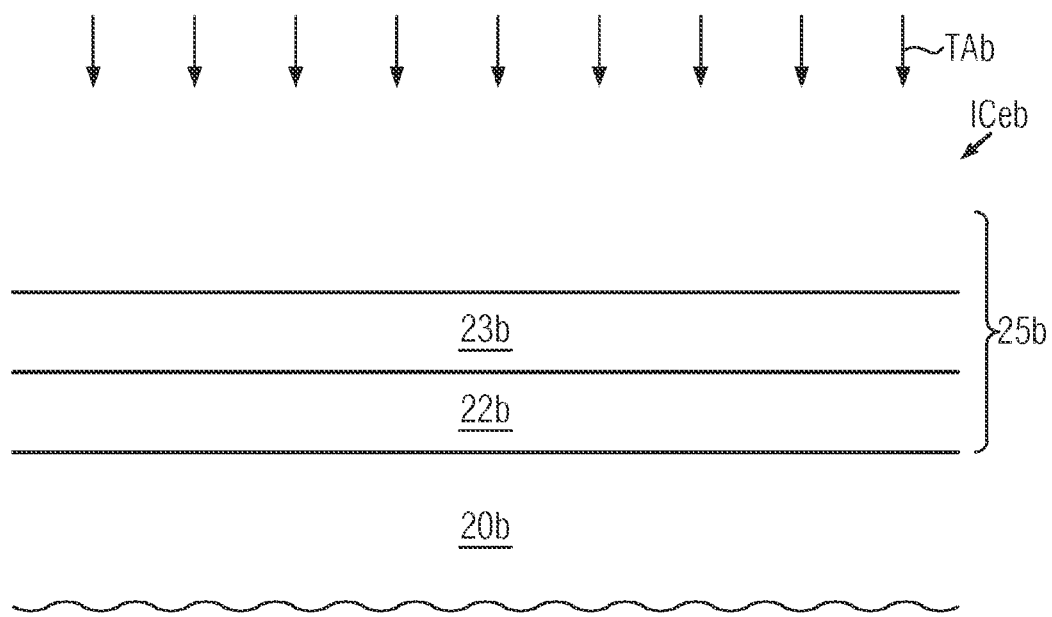

As illustrated in FIG. 2b, the layer stack 25b comprises a first layer 22b and a second layer 23b. In some illustrative embodiments, the first layer 22b may correspond to the first layer 22a as described above with regard to FIG. 2a, while the second layer 23b may represent an insulating material layer in accordance with the insulating layer 23a as discussed above with regard to FIG. 2a. In other illustrative embodiments, the first layer 22b may represent an insulating material layer corresponding to the insulating layer 23a as discussed above with regard to FIG. 2a. Herein, the second layer 23b may either be omitted at the presently described stage during fabrication or may represent the second layer 24a as described above with regard to FIG. 2a.

The layer stack 25b may be formed in accordance with processes as described above with regard to the layer stack 25a.

As illustrated in FIG. 2b, at the illustrated stage during fabrication of the integrated circuit element ICeb, a thermal annealing process TAb may be performed. The thermal annealing process TAb may be performed in accordance with the above description provided with regard to the annealing process TAa, i.e., the annealing process TAb may be configured in analogy to the afore-described annealing process TAa.

The person skilled in the art will appreciate that the integrated circuit element ICeb as illustrated in FIG. 2b may represent one of a transistor element at an early stage during fabrication or a capacitor at an early stage during fabrication. Although not illustrated in FIG. 2b, a small layer (not illustrated) may be optionally disposed between the first layer 22b and the substrate 20b. The optional small layer (not illustrated) may be an oxide liner or may represent a germanium channel.

Electrical characteristics of some illustrative embodiments of the present disclosure will be described in greater detail with regard to FIG. 4. The following discussion is only provided for illustrative purposes and the person skilled in the art will appreciate that no limitation of the present disclosure onto the description as provided below is intended.

Figure 4:
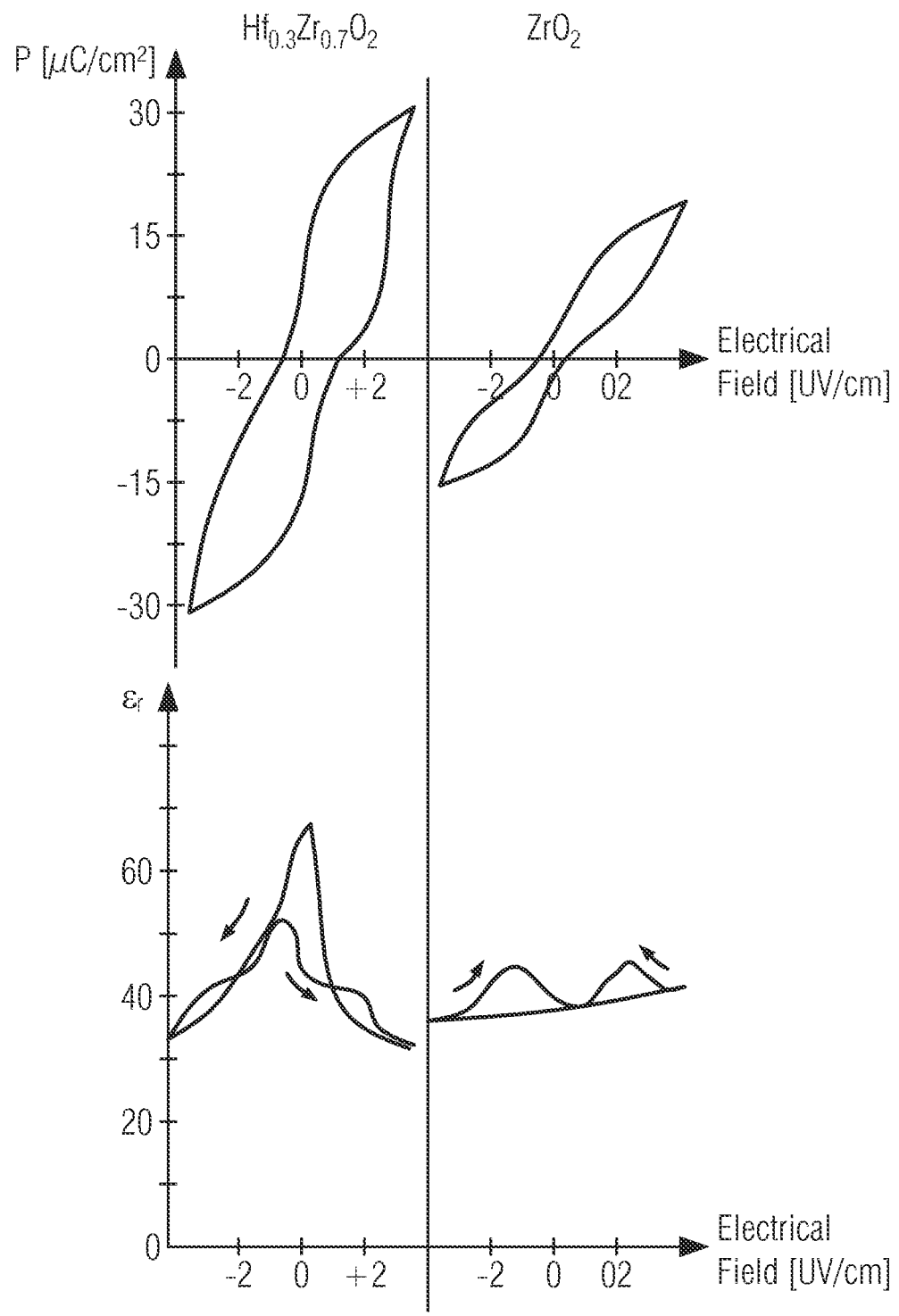
FIG. 4 schematically illustrates a hysteresis loop and a dependence of the dielectric constant for different $HfO_2$—$ZrO_2$ solid solutions having different mixing ratios of the oxides.

FIG. 4 graphically represents hysteresis loops obtained for an insulating layer having a $HfO_2$—$ZrO_2$ solid solution of about 70 mol % of $ZrO_2$ and 100 mol % $ZrO_2$. When increasing the content of $ZrO_2$ towards 100 mol %, the remanent polarization (the ordinate represents polarization P in units of $\mu C/cm^2$) and the coercive field strength (the abscissa represents the applied electric field in units of MV/cm) decrease to about 0. Despite the decrease in the coercive field strength and the remanent polarization, the loop illustrated in FIG. 4 still shows a non-linear behavior resulting in two local maximums in the relative dielectric constant ($E_r$, in the graphical representation under the hysteresis loop). The person skilled in the art understands that the relative dielectric constant may be related to the inclination of the hysteresis loop dP/d(electric field). This particular behavior is generally referred to as "antiferroelectric" as opposed to "ferroelectric," the denotation being chosen in accordance with the corresponding magnetic counterparts "antiferromagnetic" and "ferromagnetic." However, a paraelectric medium shows basically a linear dependence of the polarization on the applied electric field with no remanent polarization.

The inventors understood that the dielectric constant or k-value may be substantially higher in dielectric materials being in the antiferroelectric phase than in paraelectric materials or even in ferroelectric materials (at least partially). In some illustrative embodiments as described herein, the dielectric constant or k-value may be effectively boosted by about up to 400% or even more in comparison to conventional high-k dielectric materials.

Figure 5:
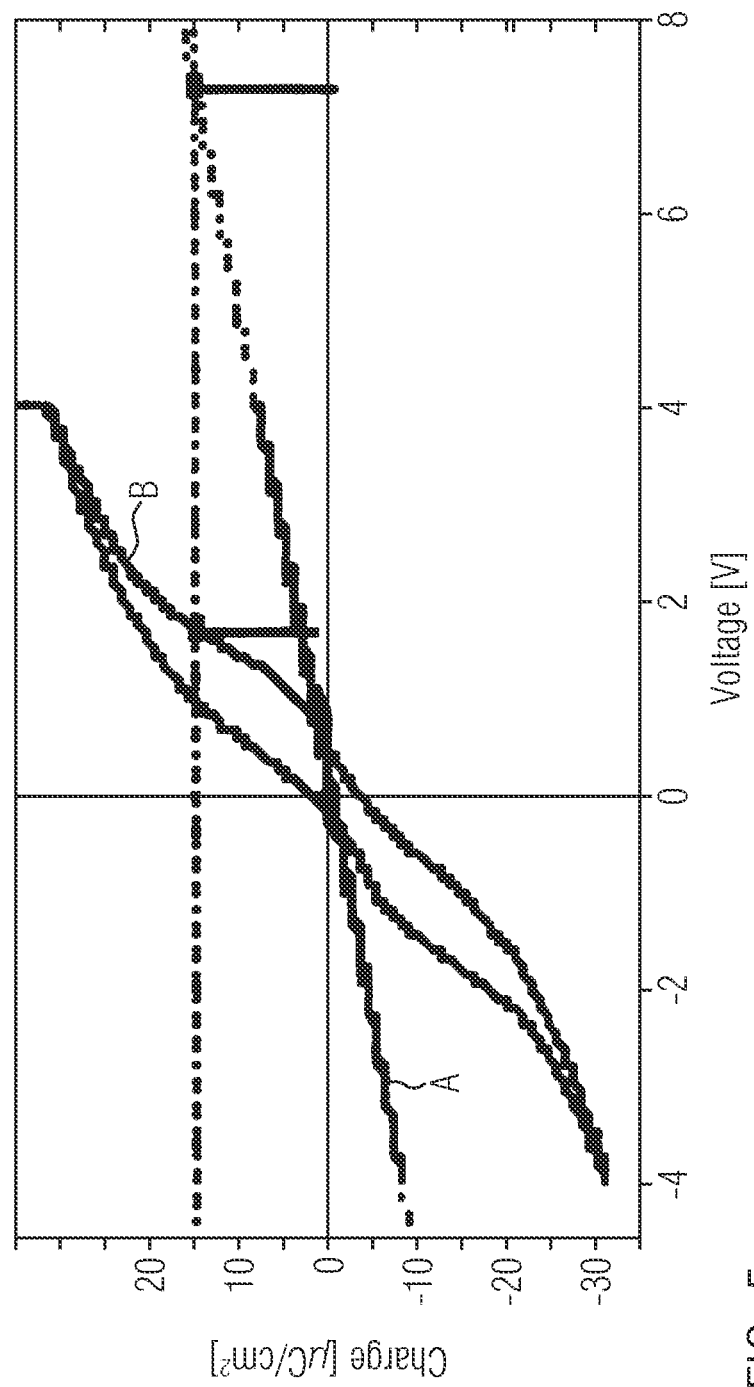
FIG. 5 schematically illustrates a graphical relation between charge density on electrodes of a capacitor and associated voltage present at the electrodes of a dielectric layer according to the present disclosure as obtained by the inventors.

FIG. 5 shows graphically a relation between the charge density on electrodes of a capacitor and the associated voltage present at the electrodes. Particularly, a curve A in FIG. 5 represents a charge—voltage relation as it is expected for conventional capacitors as, for example, discussed with regard to FIG. 1. Curve B represents a charge—voltage relation in capacitors comprising an insulating material in the antiferroelectric phase in accordance with the present disclosure.

Due to the antiferroelectric behavior of the insulating material, the charge density in case of curve B is very low at small voltages, while becoming increasingly stronger with increasing voltage as compared to conventional capacitors (curve A). Therefore, a high target load, e.g., about 15 $\mu C/cm^2$, may be already reached at comparably small voltage drops across the capacitor, in the present illustrated example about 2 V, as opposed to much higher voltage drops in conventional capacitors, e.g., 7 V in the illustrated example.

The exemplary curves illustrated in FIG. 5 were obtained by preparing a sample having an insulating layer of doped $HfO_2$ in the antiferroelectric phase with a thickness of 10 nm (represented by curve B), while curve A represents a sample having a conventional $HfO_2$ insulating material layer in the paraelectric phase with a thickness of 10 nm. The present example shows that capacitors of the present disclosure may store higher amounts of charge at relatively low voltage drops across the capacitors, therefore, avoiding the risk of dielectric breakdown due to high voltage drops as occurring in conventional capacitors.

Capacitors of the present disclosure may be used as buffer/storage/boost capacitors in integrated circuits, therefore, avoiding the need for external passive components and allowing further compactifications. The person skilled in the art will appreciate that the present disclosure allows employing advantages of dielectrics in the antiferroelectric phase in the technique of CMOS applications without running the risk of using materials that are not compatible with CMOS process flows.

In some aspects of the present disclosure, an integrated circuit element as described with regard to FIGS. 2a-2b above may relate to a passive circuit element of a capacitor type. In some other aspects of the present disclosure, an integrated circuit element of a MOSFET type is disclosed with regard to FIGS. 2a-2b. In some illustrative embodiments as described above with regard to FIGS. 2a-2b, a capping layer may be formed in between an insulating layer and an electrode layer. For example, the capping layer may comprise at least one of TiN, TaN, Ru and Pt. In some illustrative embodiments, a silicon oxide layer may be formed in between the substrate and the dielectric layer and the capping layer may be provided by TiN, for example. In some illustrative embodiments, the second layer may be provided by a capping layer. Alternatively or additionally, the first layer may be provided by a capping layer. Therefore, the insulating layer may be reliably encapsulated.

The present disclosure provides in some illustrative embodiments a method of forming an integrated circuit element, wherein the method comprises providing a substrate, depositing an amorphous high-k dielectric material layer on the substrate, depositing a capping layer on the amorphous high-k dielectric material layer, and inducing at least a partial crystallization in the amorphous high-k dielectric material layer, the at least partially crystallized high-k dielectric material layer being in an antiferroelectric phase. In some special illustrative embodiments herein, the crystallization may be induced by performing an annealing process applying an annealing temperature in a range of about 250-1100° C. In some alternative examples herein, the annealing process may be performed prior to depositing the capping layer. In some other illustrative embodiments, the capping layer may be deposited prior to inducing the at least partial crystallization and the depositing of the capping layer comprises performing a deposition process at process temperatures substantially below the crystallization temperature of the amorphous high-k dielectric material layer. In some illustrative embodiments, the depositing of the capping layer may comprise depositing a TiN layer by performing an ALD process at about 500° C. In some illustrative embodiments, the process temperatures may be substantially below about 600° C. In some illustrative embodiments, the amorphous high-k dielectric material layer may comprise $Hf_aX_bO_2$ with X being one of Zr and Si and Al and Ge and Mg and Ca and Sr and Ba and Ti and rare earth elements, where a,b>0. In some illustrative embodiments, the at least partial crystallization may be induced when depositing the capping layer. In some illustrative examples herein, the depositing of the capping layer may comprise depositing a TiN layer by performing an ALD process at about 500° C. or higher.

The person skilled in the art will appreciate that due to the antiferroelectric behavior of the gate dielectric upon application of a voltage to the gate electrode, the dielectric constant or k-value of the gate dielectric may be appropriately adjusted in dependence on the history of voltage application (route on the hysteresis loop).

The application of high-k gate dielectric materials in MOSFET devices may allow for an enhanced subthreshold slope due to the nonlinear capacitance-voltage characteristic encountered as described above. The person skilled in the art will appreciate that a gate dielectric in the antiferroelectric phase is ideally suited for HK/MG applications. Particularly, in using $Hf_aX_bO_2$. with X being one of Zr and Si and Al and Ge or another appropriate additional dopant as described above, according process sequences for forming advanced integrated circuit elements with antiferroelectric behavior may be easily included into present process flows for fabricating semiconductor devices in HK/MG applications.

In another area of application, the present disclosure may provide 3D capacitors in which a dense network of pores is formed in the surface of a semiconductor substrate, the pores being filled with a high-k dielectric material in the antiferroelectric phase. According 3D capacitors may be highly scaled. The person skilled in the art will appreciate that in, for example, using $Hf_aX_bO_2$ as disclosed herein, according 3D capacitors may be fabricated in a way that is compatible with CMOS techniques, allowing application of CMOS techniques as well as application of 3D capacitors in ICs together with highly scaled CMOS device structures.

In further areas of application, antiferroelectric capacitors may be provided as individual elements of electronic circuits. In this respect a single circuit element may be provided, the circuit element comprising a first electrode and a second electrode and an antiferroelectric dielectric material formed between the first and second electrode.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An integrated circuit element, comprising:
   a substrate;
   a dielectric layer formed over a surface of said substrate;
   a capping layer formed between said substrate and said dielectric layer; and
   an electrode layer formed over said dielectric layer, wherein said dielectric layer is at least partially in an antiferroelectric phase.

2. The integrated circuit element of claim 1, wherein said dielectric layer comprises $Hf_aX_bO_2$. with X being one of Zr and Si and Al and Ge and Mg and Ca and Sr and Ba and Ti and rare earth elements, where a,b>0.

3. The integrated circuit element of claim 2, wherein X is Si and 0.88<a <0.95, 0.05<b <0.2.

4. The integrated circuit element of claim 2, wherein X is Al and 0.88<a <0.95, 0.05<b <0.2.

5. The integrated circuit element of claim 1, further comprising a capping layer formed in between said dielectric layer and said electrode layer.

6. The integrated circuit element of claim 5, wherein said capping layer comprises at least one of TiN, TaN, Ru and Pt.

7. The integrated circuit element of claim 6, wherein said electrode layer comprises silicon.

8. The integrated circuit element of claim 6, further comprising a silicon oxide material layer formed in between said dielectric layer and said substrate.

9. The integrated circuit element of claim 1, wherein said electrode layer comprises at least one of a metal nitride material and a noble metal material and their respective oxides.

10. The integrated circuit element of claim 1, wherein said capping layer comprises a metal nitride material and a noble metal material and their respective oxides.

11. An integrated capacitor, comprising:
    a semiconductor substrate;
    an insulating layer comprising $Hf_aX_bO_2$, wherein X is one of Si and Al with 0.88<a<0.95 and 0.05<b<0.2; and
    a top electrode layer formed over said substrate, wherein said insulating layer is at least partially in an antiferroelectric phase.

12. The integrated capacitor of claim 11, further comprising a bottom electrode layer formed on said semiconductor substrate, wherein said insulating layer is formed on said bottom electrode layer.

13. The integrated capacitor of claim 11, wherein said substrate is doped for forming a bottom electrode of said integrated capacitor.

14. The integrated capacitor of claim 11, wherein said integrated capacitor is a buffer or storage or boost capacitor in an integrated circuit.

15. An integrated circuit element, comprising:
    a substrate;
    a dielectric layer comprising $Hf_aX_bO_2$ formed over a surface of said substrate, wherein X is one of Si and Al with 0.88<a<0.95 and 0.05<b<0.2; and
    an electrode layer formed over said dielectric layer, wherein said dielectric layer is at least partially in an antiferroelectric phase.

16. The integrated circuit element of claim 15, further comprising a capping layer formed in between said dielectric layer and said electrode layer.

17. The integrated circuit element of claim 16, wherein said capping layer comprises at least one of TiN, TaN, Ru and Pt.

18. The integrated circuit element of claim 17, wherein said electrode layer comprises silicon.

19. The integrated circuit element of claim 17, further comprising a silicon oxide material layer formed in between said dielectric layer and said substrate.

20. The integrated circuit element of claim 15, wherein said electrode layer comprises at least one of a metal nitride material and a noble metal material and their respective oxides.

21. The integrated circuit element of claim 20, further comprising a capping layer formed between said substrate and said dielectric layer.

22. The integrated circuit element of claim 21, wherein said capping layer comprises a metal nitride material and a noble metal material and their respective oxides.

23. The integrated circuit element of claim 2, wherein X is Zr with a <0.5 and b>0.5.

\* \* \* \* \*